(12) United States Patent
Theodoras, II et al.

(10) Patent No.: US 7,731,432 B2
(45) Date of Patent: Jun. 8, 2010

(54) MULTIPLE CHANNEL OPTICAL TRANSCEIVER MODULES WITH COMPATIBILITY FEATURES

(75) Inventors: James Theodoras, II, Plano, TX (US);
Matthew L. Heston, Plano, TX (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 12/401,140

(22) Filed: Mar. 10, 2009

(65) Prior Publication Data
US 2009/0169154 A1 Jul. 2, 2009

Related U.S. Application Data

(63) Continuation of application No. 11/276,045, filed on Feb. 10, 2006, now abandoned, which is a continuation-in-part of application No. 10/847,948, filed on May 17, 2004, now Pat. No. 7,447,440.

(51) Int. Cl.
*G02B 6/36* (2006.01)
*H04B 10/00* (2006.01)

(52) U.S. Cl. ........................................ 385/92; 398/138
(58) Field of Classification Search ...................... None
See application file for complete search history.

(56) References Cited

U.S. PATENT DOCUMENTS

| 6,872,007 | B2 | 3/2005 | Botham |
| 6,873,800 | B1 | 3/2005 | Wei et al. |
| 6,883,971 | B2 | 4/2005 | Chiu et al. |
| 7,447,440 | B2 | 11/2008 | Theodoras, II |

*Primary Examiner*—Tina M Wong (57) ABSTRACT

Optical transceiver modules with multiple channel connection with connectors on a motherboard of a line card for network devices, such as a switch, router, crossconnect and the like, are presented. The modules have staggered electronic boards which can engage the connectors which are laterally displaced on the motherboard. The connectors are also arranged so that one of them can engage an optical transceiver module in an SFP connection so that the motherboard connectors are compatible with multiple channel and single channel (SFP) connections.

20 Claims, 10 Drawing Sheets

MULTIPLE CHANNEL OPTICAL TRANSCEIVER MODULES WITH COMPATIBILITY FEATURES

This application is a continuation of U.S. patent application Ser. No. 11/276,045, filed on Feb. 10, 2006 now abandoned, the entirety of which is incorporated herein by reference, which in turn is a continuation-in-part of U.S. patent application Ser. No. 10/847,948, entitled "MULTIPLE CHANNEL OPTICAL TRANSCEIVER MODULES," filed on May 17, 2004, now U.S. Pat. No. 7,447,440, and assigned to the present assignee.

BACKGROUND OF THE INVENTION

The present invention is related to optical transceiver modules and their connections. More specifically, the invention is related to optical transceiver modules with multiple channels including a dual row pattern of optical emitters/detectors and separate transmit and detect electronics and connections which are adapted to such multiple channel, optical transceiver modules, as well as currently single channel, optical transceiver modules.

As fiber optics developed, many new technologies emerged to enhance their use. For example, fairly recently, a specification for a new generation of optical modular transceivers was developed named "small form-factor pluggable" (SFP). SFP transceivers are designed to be high bandwidth, small physical size and easily changeable (including being hot-swappable) on the line card of a network device.

Unfortunately, integrated circuit (e.g., application specific integrated circuit or ASIC) densities have increased to the point that line cards are now optical port density limited, rather than switch or processor limited. Thus, the electronics on the motherboards of the line card have the capacity to process more optical information than is currently being transmitted and received from the optical ports of the line card. This extra capacity is potential bandwidth that is not being realized. As a result, many line cards that use conventional SFP optics have unused bandwidth.

There have been many attempts to achieve higher optical port densities. For example, parallel ferrule connectors have been utilized to solve the problem of optical port density on the line card faceplate. However, this typically requires fanout cables that are bulky, expensive and may be unreliable.

Single-mode parallel solutions are available, but they have typically been very large, expensive and difficult to manufacture. Additionally, they may require permanently attached fiber pigtails due to alignment requirements.

As a solution to solve the high cost of these early parallel offerings, the parallel vertical cavity self emitting laser (VCSEL) technology was developed. However, VCSEL technology blossomed at shorter wavelengths (e.g., 850 nm) and enabled only very short multi-mode applications. Also, the majority of VCSEL based parallel optics are designed for parallel data transfer, where all channels of data are synchronous or plesiochronous. These products, therefore, typically do not allow multiple channels that are totally independent (e.g., four independent, serial data channels). Lastly, the reliability of this solution is still questionable.

It would be beneficial to have innovative techniques for providing optical transceiver modules that provides multiple channel optics without the disadvantages normally associated with this capability. Additionally, it would be beneficial if the optical and electrical crosstalk is reduced or eliminated.

DETAILED DESCRIPTION

In the description that follows, the present invention is described with reference to embodiments that are used in association with multiple channel optical transceivers for use with line cards of network devices. However, embodiments of the invention are not limited to any particular version, protocol, environment, application, or implementation. For example, although the invention is described in reference to specific embodiments, the invention can be advantageously applied to many embodiments. Therefore, the description of the embodiments that follows is for purposes of illustration and not limitation.

Furthermore, it should be noted the same reference numerals in different drawings for elements which are identical or similar for ease of explanation.

Figure 1A:
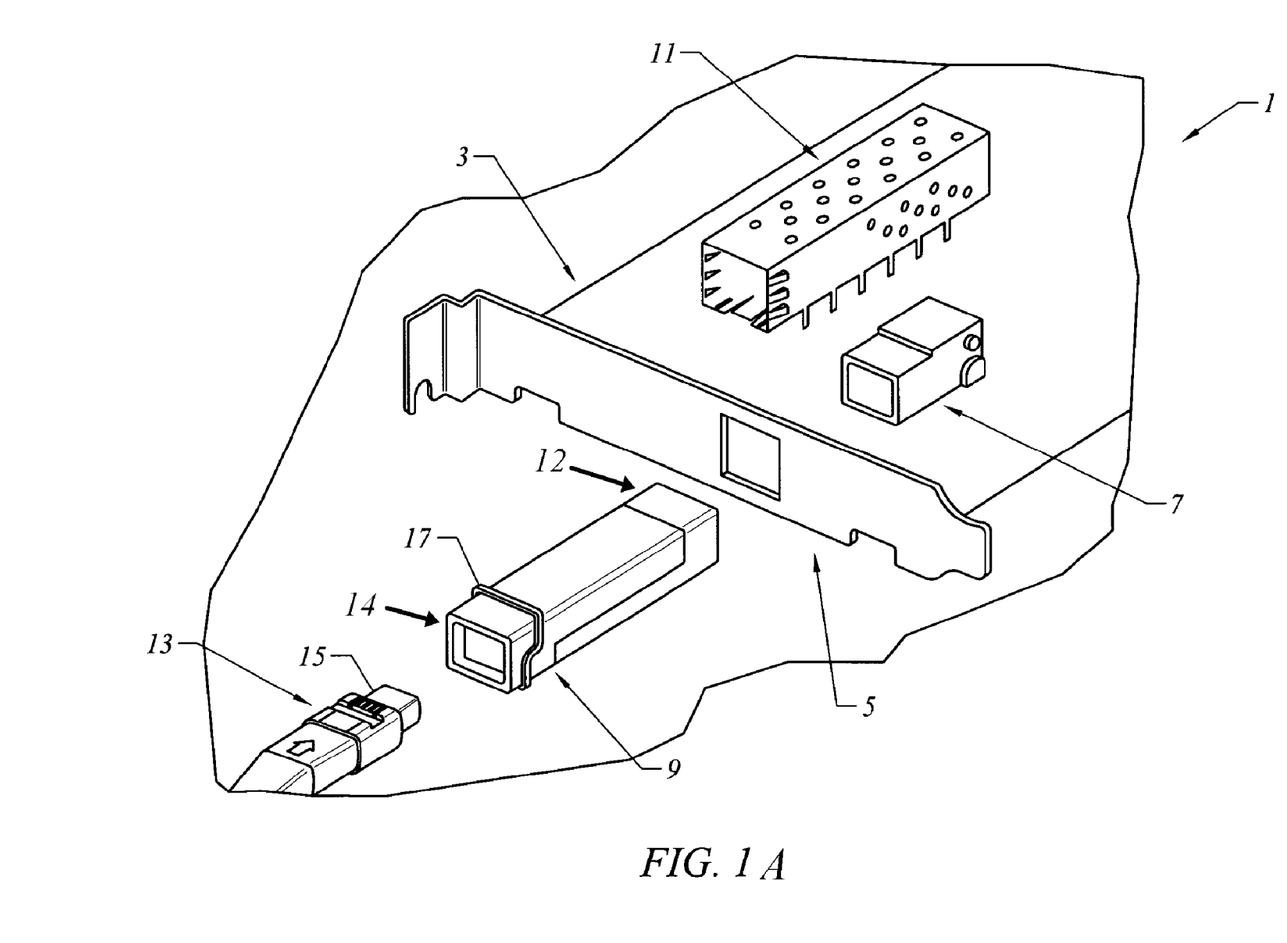
FIG. 1A shows an example of a parallel optical transceiver module that is pluggable into a line card.

FIG. 1A shows an example of a multiple channel optical transceiver according to one embodiment of the present invention that is pluggable into a line card 1 of a network device, such as a switch, router, crossconnect, and the like. The line card 1 includes a motherboard 3 which has electrical components/connections (not shown) and a bezel 5. A connector 7 is mounted on motherboard 3 in order to electrically couple an optical transceiver module 9 to the electrical components on the motherboard 3. One end 12 of the optical transceiver module 9 (shown in greater detail in FIG. 1B) is pluggable into the connector 7. A cage assembly 11 is mounted on the motherboard 3 to protect and retain the optical transceiver module 9 when it is inserted into the connector 7. As shown in FIG. 1C, the connector 7 on the motherboard 1 has two slots 10 for accepting parallel electronic boards 27 that are housed within the optical transceiver module 9. See FIG. 1B. Rows of pins 8 are associated with the slots 10 to make electrical contact with corresponding pins 6 on the electronic boards 27 of the optical transceiver module 9. The connector 7 can be a single two-row connector or two single-row connectors one above the other.

Figure 1B:
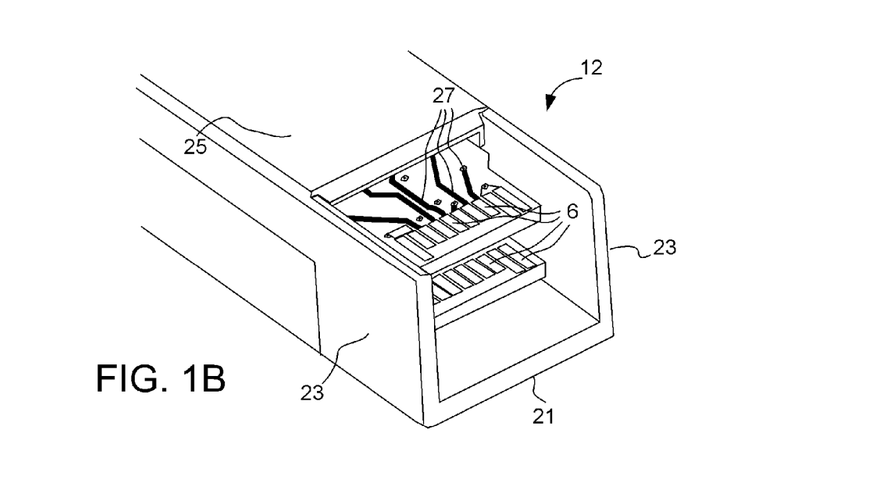
FIG. 1B illustrate in detail of one end of a parallel optical transceiver module.
Figure 1C:
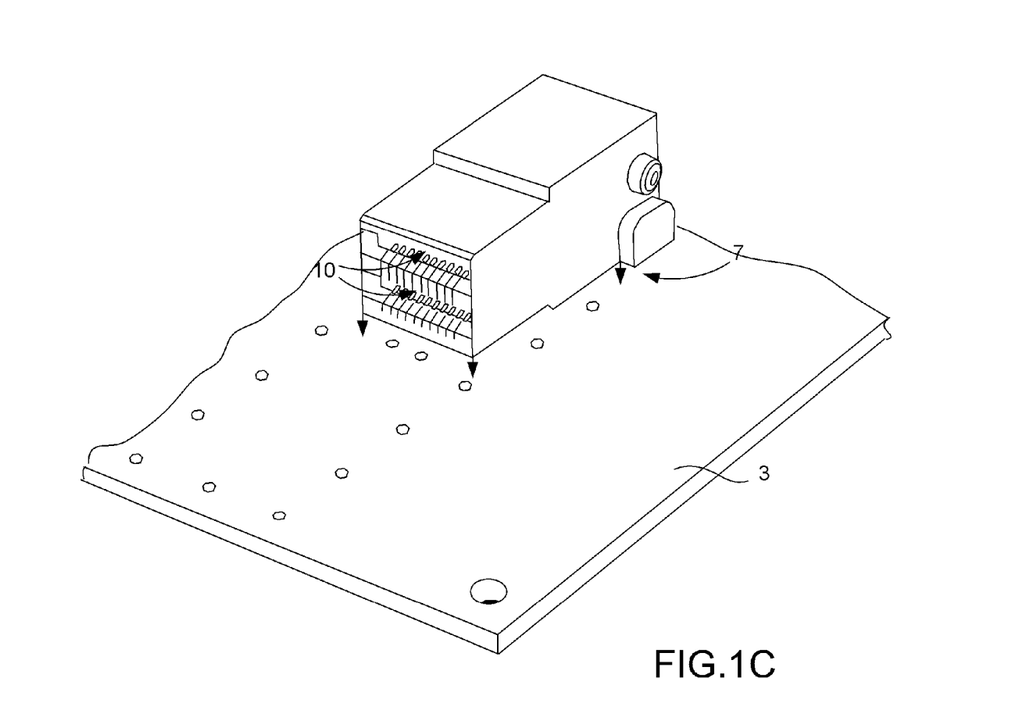
FIG. 1C shows the details of a motherboard connector which receives the end of the optical transceiver module of FIG. 1B.

FIG. 1B shows the end 12 of the optical transceiver module 9 in greater detail. The module 9 has a housing which is enclosed on three sides, a "bottom" 21, and two sides 23. The end of a "top" 25 is open. Note that in FIG. 1A, the bottom 21 of the housing is shown as being on top. Two parallel electronic boards 27 are mounted in the housing one above the other and extend laterally coextensively toward the edges of the housing bottom 21 and sides 23. The conducting pins 6 located at the edges of the electronic boards 27 and are connected to leads on the boards 27. An internal configuration of the optical transceiver module 9 is discussed in more detail with reference to FIG. 3.

The opposite end 14 of the optical transceiver module 9 can receive a plug 13. For example, the plug can be an MTP or MPO plug. The plug 13 includes a ferrule 15 that retains and aligns the multiple optical fibers in a cable. As shown, the optical transceiver module 9 can include a latch 17 to assist in retaining the plug 13 in the transceiver module 9 when inserted therein. Other types of plugs and retention mechanisms can be utilized with other embodiments.

Figure 2A:
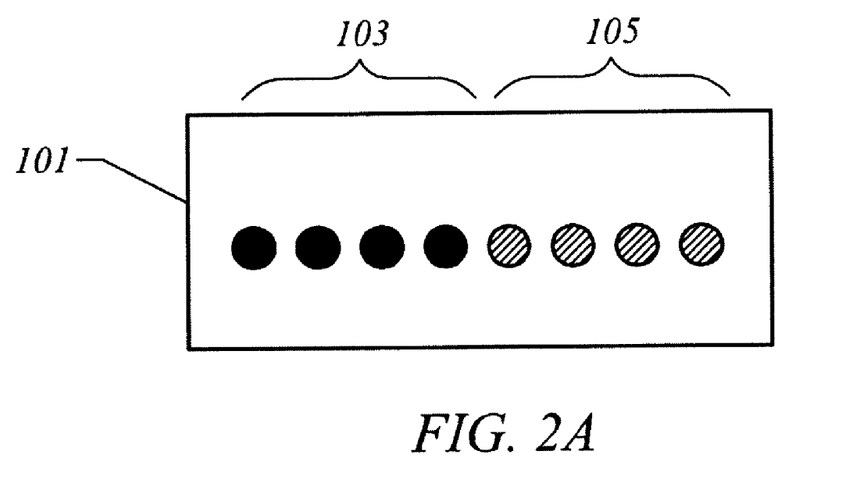
FIGS. 2A and 2B show conventional ferrule patterns that include transmitting and receiving optical fibers.
Figure 2B:
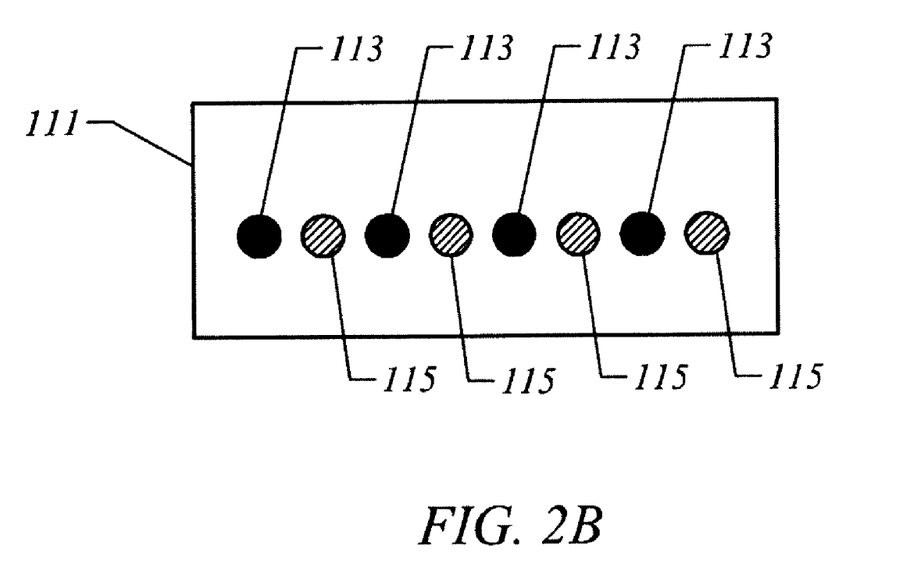

The ferrule 15 retains optical fibers so they can interface with corresponding optical emitters and optical detectors in the optical transceiver module 9 in a particular manner described below, according to an embodiment of the present invention. On the other hand, FIGS. 2A and 2B show conventional ferrule patterns that include transmitting and receiving optical fibers. In FIG. 2A, a ferrule 101 retains eight optical fibers. Typically, the spacing of the optical fibers in this arrangement is every 125 microns. Four of the optical fibers 103 transmit to the optical transceiver module and four of the optical fibers 105 receive optical transmissions from the optical transceiver. In this configuration, optical fibers that are similar are grouped together. FIG. 2B shows a different ferrule pattern. A ferrule 111 includes four optical fibers 113 that transmit to the optical transceiver module alternating with four optical fibers 115 that receive optical transmissions from the optical transceiver. In this configuration, transmitting and receiving optical fibers are alternated.

The optical emitters and detectors within the optical transceiver module are aligned with the optical fibers in the ferrule. For example, a bar that includes both laser diodes and detectors may need to be manufactured for the ferrule patterns of FIGS. 2A and 2B. A problem results in that laser diodes and detectors are generally incompatible, which makes hybrid bars difficult to manufacture with resulting low yields. Additionally, the spacing between transmitting and receiving optical fibers can be fairly close (e.g., 125 microns), which can increase optical crosstalk.

Figure 2C:
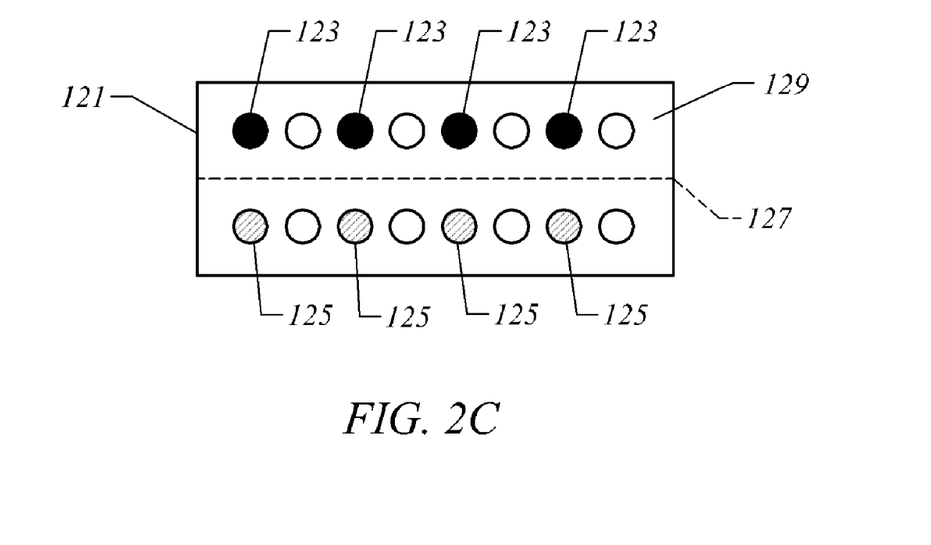
FIG. 2C shows a ferrule pattern of one embodiment of the invention for interfacing with a row of four optical emitters and a row of four optical detectors.

FIG. 2C shows a ferrule pattern of one embodiment of the invention for interfacing with a row of four optical emitters and a row of four optical detectors. A dual row ferrule 121 retains eight optical fibers. A row of four optical fibers 123 that transmit to the optical transceiver module 9 are disposed parallel to a row of four optical fibers 125 that receive optical transmissions from the optical transceiver module 9. As indicated by a dashed line 127, a bar of laser diodes can be manufactured and then combined with a bar of laser detectors which is manufactured separately from the laser diode bar. Thus, manufacturing a hybrid bar is not required.

Furthermore, the additional spacing between the laser diodes and detectors results in reduced optical crosstalk. For example, because the fabrication of every other laser diode or detector 129 can be skipped, the spacing can be 250 microns between adjacent laser diodes and detectors (i.e., both within a row and row-to-row). Additionally, this configuration creates multiple transmit/receive pairs, which makes transitions to duplex fiber cable much easier.

Conventional equipment and settings can be utilized to manufacture these bars. As an example, the equipment for manufacturing bars for the ferrules of FIGS. 2A and 2B can be utilized to make the separate bars. When done in this manner, the fabrication of every other laser diodes and detectors 129 as described can be skipped to save costs. Alternatively, laser diodes and detectors 129 can be manufactured on the bars, but not utilized.

Figure 2D:
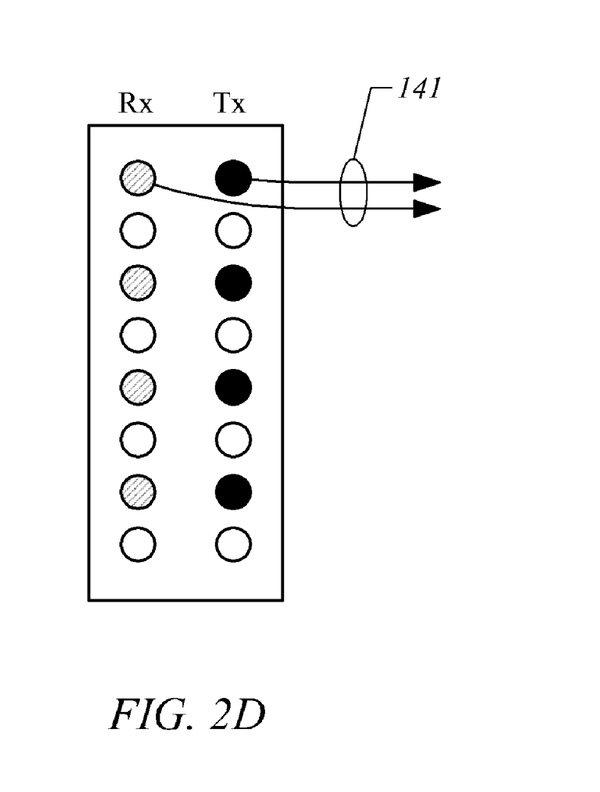
FIG. 2D shows how the optical fibers from the ferrule pattern in FIG. 2C can be dressed out as one or more fiber pairs.

FIG. 2D shows how the optical fibers from the ferrule pattern in FIG. 2C can be dressed out as one or more fiber pairs which each form a bidirectional communication channel. As shown, a pair 141 includes a transmitting optical fiber and a receiving optical fiber. In some embodiments, four pairs are supported. Each pair can be a line cord pair (e.g., similar to speaker wire) where a user can separate the individual lines as the desired. By allowing the transmit and receive optical fibers to go to different locations, daisy-chained connections can be easily supported. Parallel ribbon fiber optic cables require all ports to go to a same port and requires receiving and transmitting optical fibers to go to the same transceiver, which prevents daisy-chaining. Conventional techniques, such as the use of two breakout cables, couplers and cables, also do not provide the flexibility provided by embodiments of the invention.

In other embodiments, the optical fibers are dressed out in single lines (e.g., eight single lines). In still other embodiments, mixed pairs and single lines can be present. Thus, the optical fibers can be dressed out in different configurations depending on the application (see also FIG. 6).

Figure 3:
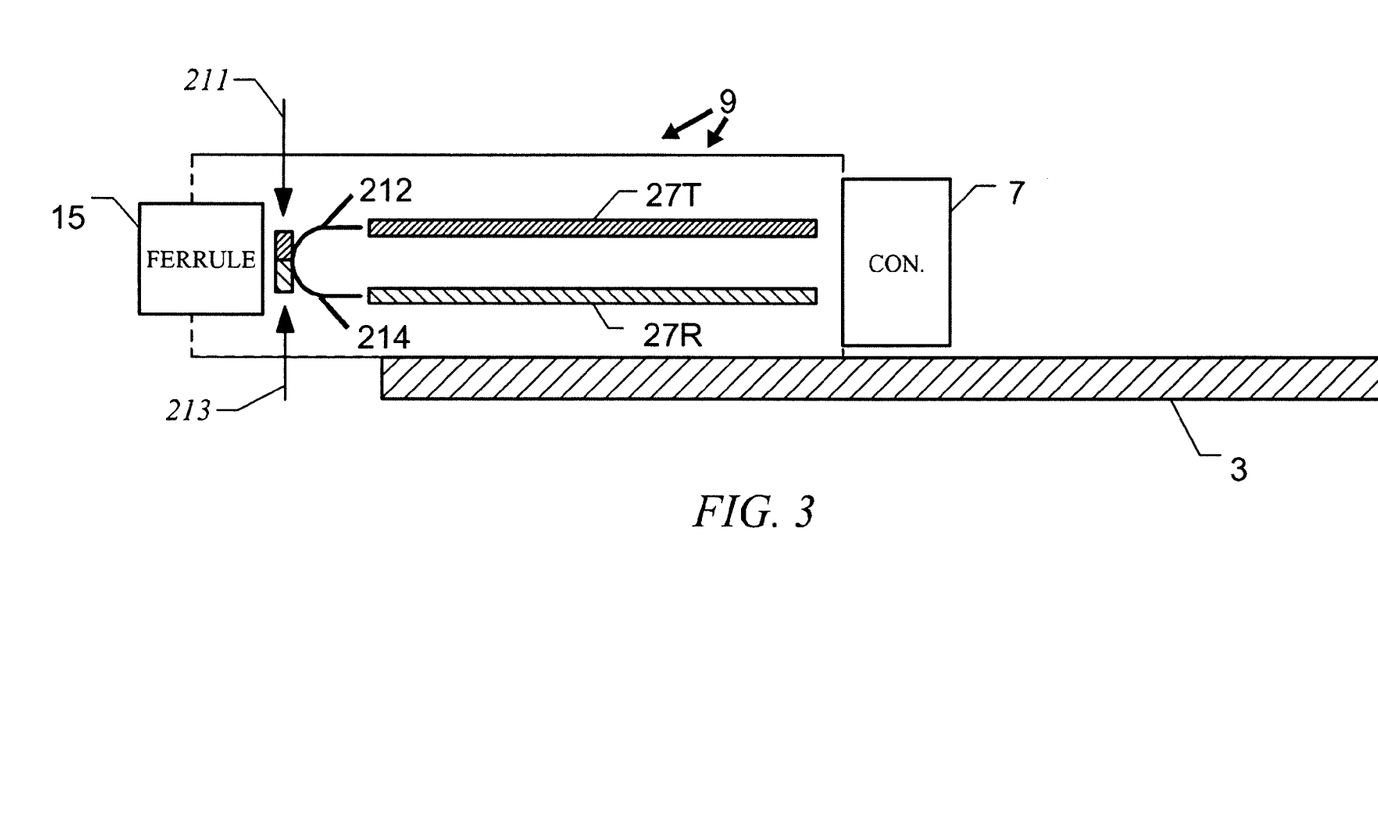
FIG. 3 illustrates an embodiment of the invention including transmit and receive bars and separate electronic boards for transmitting and receiving.

Now the description turns to further specifics of the optical transceiver module 9 according to the present invention. FIG. 3 illustrates one arrangement of the optical transceiver module 9 which includes transmit and receive bars and separate electronic boards for transmitting and receiving. As described with respect to FIG. 1, the motherboard 3 has the connector 7 mounted thereon. At the end 12 of the optical transceiver module 9, the boards have edge connectors, pins 6, that provide the electrical connection to the motherboard 3 via connector 7 when inserted into the twin slots 10 of the connector 7. As shown in FIG. 1C, the connector 7 has two slots 10 and associated rows of pins 8 for accepting the parallel electronic boards 27 that are housed within the optical transceiver module 9 (the dashed lines represent the outline of the module 9 so that internal components can be seen). One of the electronic boards 27 within the optical transceiver module 9 is a transmitting electronic board 27T and the other is a receiving electronic board 27R. Each board 27T and 27R has the electrical circuitry and components to perform its associated tasks. Flexible electrical connections 212 couple the transmitting electronic board 27T to a transmitting bar 211, which can have a row of laser diodes or LEDs (see, e.g., FIG. 2C). Similarly, flexible electrical connections 214 couple the receiving electronic board 27R to a receiving bar 213, which can have a row of laser detectors.

The ferrule 15 (e.g., a MTP ferrule) is a part of the cable plug 13 and retains the receiving optical fibers 123 and transmitting optical fibers 125 so they can optically couple to the receiving bar 213 and transmitting bar 211 respectively. Electrical crosstalk within the optical transceiver module 9 is reduced or eliminated because the transmitting and receiving electronics are on separate, parallel boards as shown. Conventional optical transceivers modules include an electronic board with both transmitting and receiving circuitry/components, which facilitates electrical crosstalk.

Figure 4:
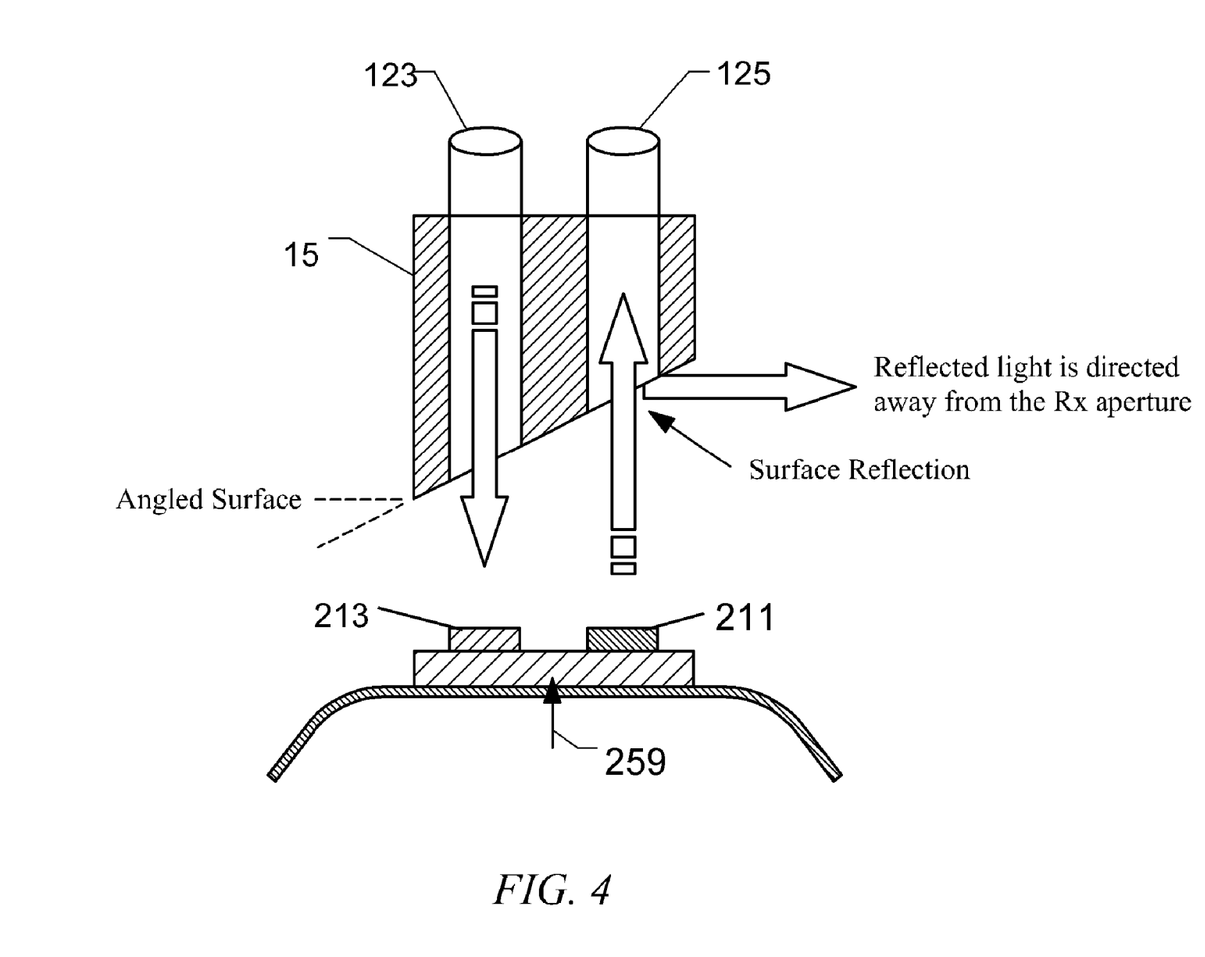
FIG. 4 shows the dual row orientation taking advantage of an angled surface on the ferrule to reduce optical crosstalk in the transceiver.

FIG. 4 shows how the dual row orientation in some embodiments of the present invention can take advantage of an angled surface on the ferrule 15 to reduce optical crosstalk in the optical transceiver module 9. Receiving optical fibers 123 delivers light to the receiving bar 213. Similarly, light from the transmitting bar 215 is delivered to transmitting optical fibers 125. In the cross-sectional view of FIG. 4, only a pair of receiving and transmitting optical fibers 123 and 125 are shown. The receiving bar 213 and transmitting bar 215 are on a substrate 259 and communicates to the electronic boards 27R and 27T through the flexible electrical connections 212 and 214 shown in FIG. 3.

The ferrule 15 retains the optical fibers and is angled at the end proximal to receiving and transmitting bars 213 and 215, respectively. The orientation of the receiving and transmitting bars to the angle of the ferrule is designed so that light reflected at the aperture of transmitting optical fiber 125 is directed away from the aperture of receiving optical fiber 123. Thus, optical crosstalk can be reduced by the specific orientation of the optical emitters and detectors relative to the angled end on ferrule 15.

Figure 5A:
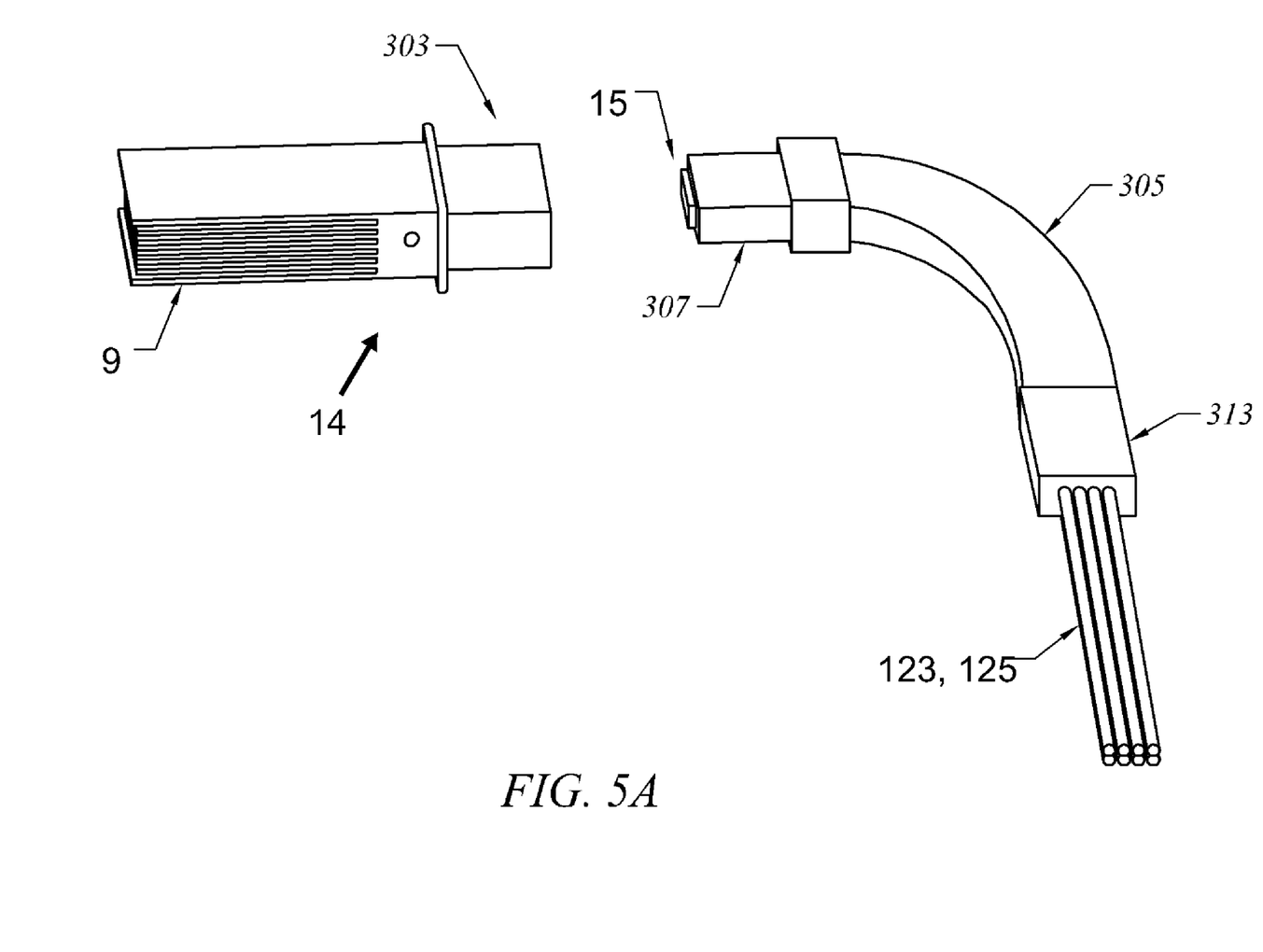
FIGS. 5A and 5B show an example of a cable that can be connected to a parallel optical transceiver of the invention.
Figure 5B:
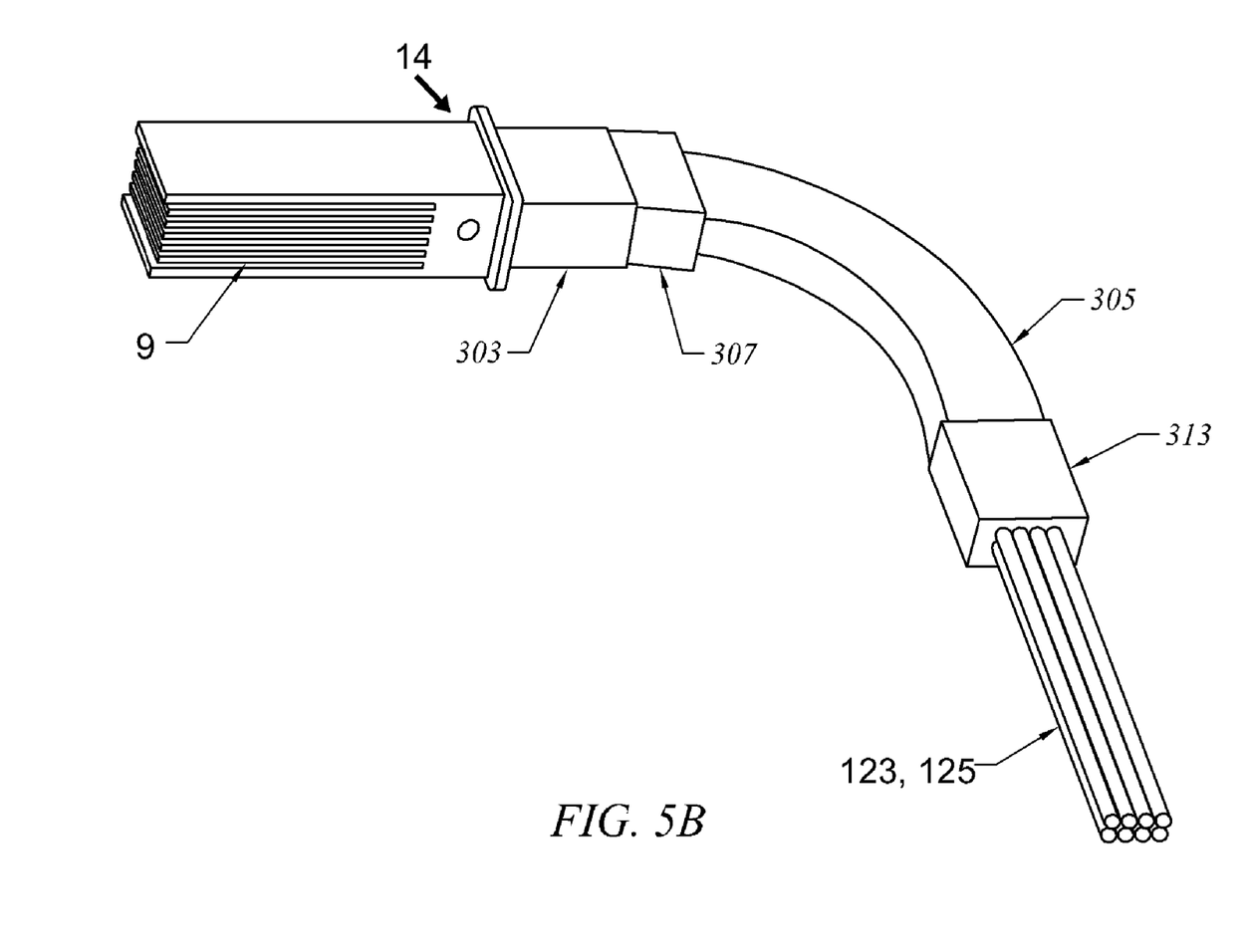

FIGS. 5A and 5B show an example of a cable that can be connected to the parallel optical transceiver module 9 of the invention.

With regard to FIG. 5A, the optical transceiver module 9 includes an adapter 303 at the end 14 for receiving the end of a cable housing 305. The cable housing 305 includes a dense face mountable interconnect 307 for connecting to the adaptor 303. The ferrule 15 retains the optical fibers for optical coupling to optical emitters and detectors in optical transceiver module 9. As shown, the cable housing 305 has a 90° bend, which may be desirable for routing the cables. Eight cables 123 and 125 are shown extending out of a furcation block 313. These cables can be dressed out as four independent duplex cables for connection to line cards in other network devices. In other embodiments, there can be fewer or more cables, the cables can be dressed out as pairs or as single cables, or any combination depending on the application.

FIG. 5B shows the dense face mountable interconnect 307 of cable housing 305 inserted into the optical transceiver module 9. These figures illustrate one way of connecting the optical transceiver module to the optical fibers in the cables, but other techniques may be advantageously utilized with the invention.

Figure 6:
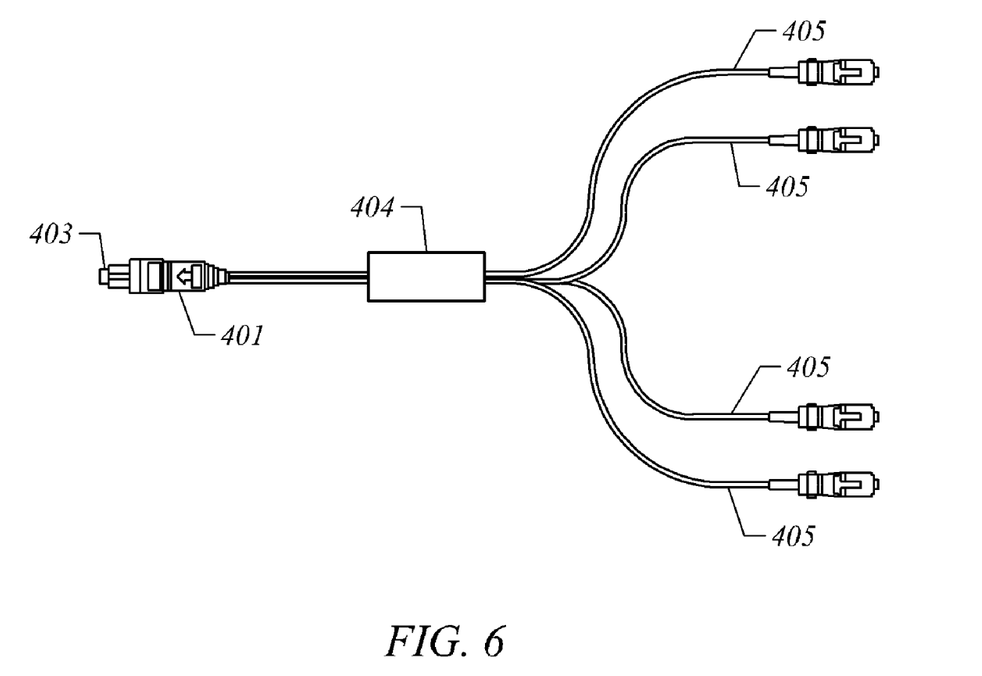
FIG. 6 illustrates another example of a cable that can be utilized with embodiments of the invention.

For example, in one embodiment, a MTO or MTP plug 13 is utilized that fans out into four duplex cables. FIG. 6 illustrates an example of this cable. The plug 13 houses the ferrule 15 that retains the optical fibers 123 and 125. The parallel cable of the optical fibers is separated out into individual optical fibers by a furcation block 404. The furcation block 404 can provide buffering and strain-relief in addition to routing the optical fibers into standard "yellow jacket" cabling. Pairs of eight transmitting and receiving optical fibers 123 and 125 are dressed out into four duplex cables 405 as shown. As mentioned previously, the optical fibers may be also dressed out as eight single cables or many other configurations.

Figure 7:
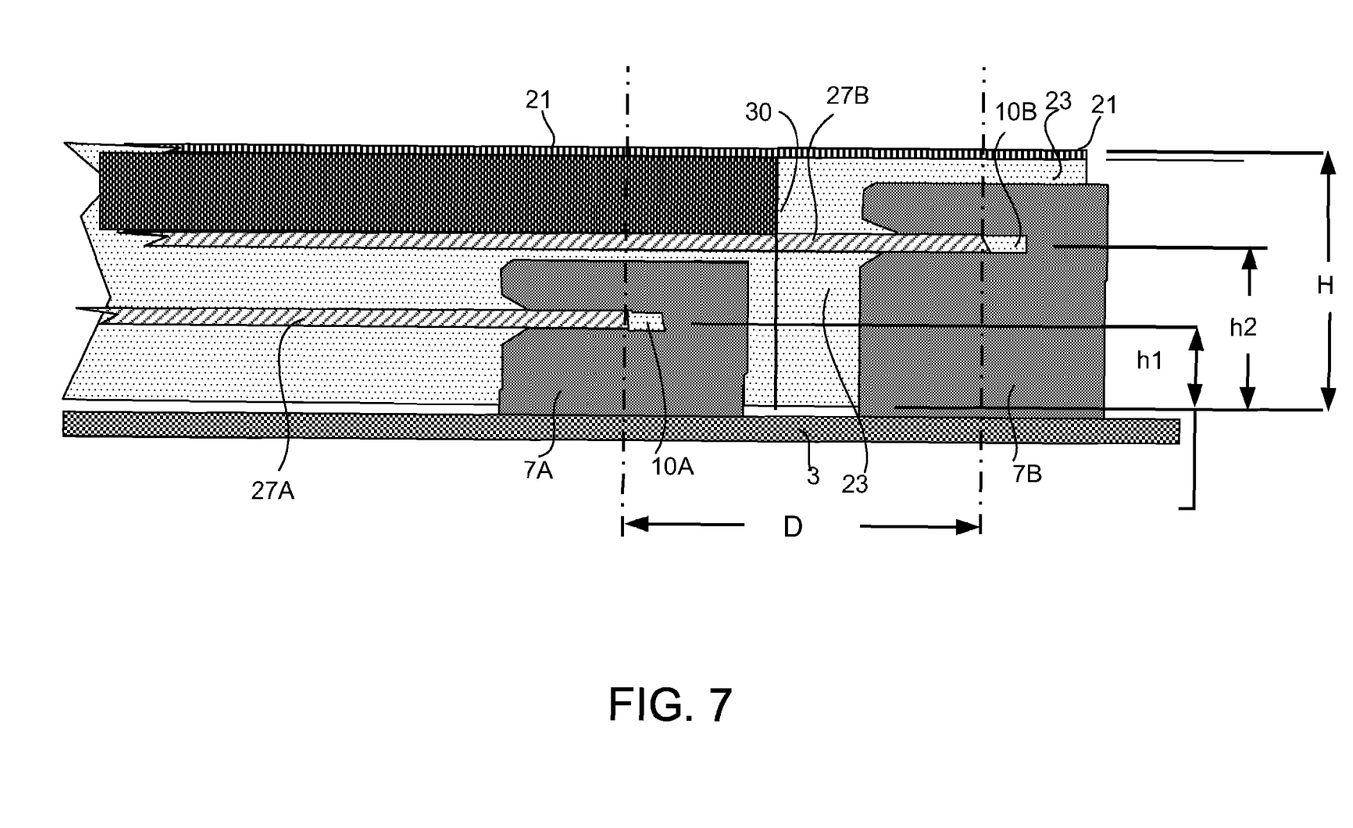
FIG. 7 is a cross-sectional sideview of one end of an optical transceiver module and corresponding motherboard connectors, according to another embodiment of the present invention.

Still another embodiment of the present invention is found in the connections between the optical transceiver module 9 and the motherboard 3 of the line card 1. FIG. 7 illustrates a cross-sectional side view of the end 12 of the optical transceiver module 9 and connectors on the motherboard 3. In this embodiment, the two electronic boards 27, labeled 27A and 27B in this drawing, are staggered laterally. The "upper" board 27B closest to the module housing "bottom" 21 extends close to the edge of the housing bottom 21 and sides 23, while the "lower" 27A does not extend as far toward the housing edge. Two connectors 7A and 7B are mounted on the motherboard 3 to make the connections to the electronic board 27A and 27B respectively. The first connector 7A has a slot 10A at a height h1 so as to receive the first electronic board 27A. The second connector 7B which is laterally displaced from the first connector 7A by a displacement D has a slot 10B at a height h2 to receive the second electronic board 27B. The edge of the second electronic board 27B is closer to the edge of the module housing, of which the "bottom" 21 is shown. When the optical transceiver module 9 is fully inserted into the cage 11 (not shown in FIG. 7, see FIG. 1) and electrical connection is made, the upper electronic board 27B passes over the connector 7A and is seated in the slot 10B of the connector 7B, while the lower electronic board 27A is seated in the slot 10A of the second connector 7A.

The electrical and optical connections of the optical transceiver module 9 can remain as described previously; the only differences being the locations of the electronic boards 27A and 27B and connectors 7A and 7B correspondingly. However, an advantage of the arrangement shown in FIG. 7 is that it can be fully compliant with existing standard SFP connections. That is, the electronic board 27A is set at the height h1 so that the electronic board of an optical transceiver module with a standard SFP connection engages the motherboard connector 7A. The vertical solid line marked 30 in FIG. 7 illustrates the edge of an optical transceiver module housing with such a standard SFP connection. In such a connection, the upper electronic board 27B is nonexistent so that the motherboard connector 7B is not engaged. Hence the connector 7A can receive a single electronic board of an SFP connection, or the connector 7A can receive one of two electronic boards staggered in an optical transceiver module, for a multiple channel connection, while the connector 7B receives the upper electronic board.

However, besides the physical compatibility with standard SFP connections, the electrical connections to connectors 7A and 7B must be modified. Since the standard SFP connection handles one bidirectional communication channel, i.e., one receiving signal and one transmitting signal, the electronic board 27A and the corresponding connector 7A which engages the board 27A must carry one receiving and one transmitting signal. For the functional capacity of the previously described multichannel optical transceiver module, the "upper" electronic board 27B and corresponding connector 7B must handle the other three channels, i.e., three receiving and three transmitting signals. Thus the upper electronic board 27B has three extra pins for the additional signal paths, as compared to the electronic boards described earlier. The electrical connections between the electronic boards and the transmitting and receiving bars 211 and 213 must also be correspondingly modified. Cf. FIG. 3. Since each board 27A and 27B must carry receiving and transmitting signals, the separation of functions for one electronic board for transmitting and the other for receiving cannot be maintained. Nonetheless, the described arrangement permits a standard SFP connection to the motherboard 3 and a multiple connection to the motherboard 3.

Therefore, while the description above provides a full and complete disclosure of the preferred embodiments of the present invention, various modifications, alternate constructions, and equivalents will be obvious to those with skill in the art. Thus, the scope of the present invention is limited solely by the metes and bounds of the appended claims.

The invention claimed is:

1. In combination, a motherboard connector assembly and an optical transceiver module, the motherboard connector assembly comprising:
a motherboard;
a bezel rigidly coupled to the motherboard with an opening configured to receive the optical transceiver module;
a first connector mounted to the motherboard inline with the opening, wherein a first slot of the first connector faces the opening; and
a second connector mounted to the motherboard inline with the opening, said second connector being horizontally offset further from the opening with respect to said first connector on the motherboard, wherein a second slot of the second connector faces the opening;
the optical transceiver module comprising:
a housing open at an end;
a first electronic board fixed within said housing and having an edge offset from said open end of said housing;
a second electronic board fixed within said housing and having an edge proximate said open end of said housing; and
an optical interface configured to receive an optical cable;
wherein the optical transceiver module is configured to be pluggably connected to the motherboard connector assembly via the opening and the first and second slots, and wherein the edge of the first electronic board is configured to electrically connect with the first connector and the edge of the second electronic board is configured to electrically connect with the second connector.

2. The combination of claim 1, wherein said first electronic board is configured to process signals of only one bi-directional communication channel to and from the first connector on the motherboard connector assembly, and the second electronic board is configured to process signals for each of multiple bi-directional communication channels to and from the second connector on the motherboard connector assembly.

3. The combination of claim 1, and further comprising a ferrule element of a cable that contains a plurality of transmitting optical fibers and a plurality of receiving optical fibers, wherein ends of the plurality of transmitting optical fibers are arranged to align with a row of optical emitters of the optical transceiver module and ends of the plurality of receiving optical fibers are arranged to align with a row of optical detectors of the optical transceiver module, and wherein an end of the ferrule element that connects to the optical receiver module comprises a surface that is angled so that any light emitted by one of the optical emitters that is reflected at an aperture to its corresponding transmitting optical fiber is directed away from an aperture of a receiving optical fiber.

4. The combination of claim 1, wherein said first connector is configured to carry signals for only one bi-directional communication channel to and from said first electronic board of said optical transceiver module.

5. The combination of claim 4, wherein said first connector is configured to achieve a small form-factor pluggable (SFP) connection with the first electronic board of the optical transceiver module.

6. The combination of claim 4, wherein said second connector is configured to carry signals for each of multiple bi-directional communication channels to and from said second electronic board of said optical transceiver module.

7. The combination of claim 1, wherein said motherboard is configured for operation as a line card of a network device, said network device selected from the group comprising a switch, router, and crossconnect.

8. The combination of claim 1, wherein the edges of the first and second electronic boards are offset from each other by a distance corresponding to a distance that the first and second connectors on the motherboard are offset from each other.

9. In combination, a motherboard connector assembly and an optical transceiver module, the motherboard connector assembly comprising:
a motherboard;
a first connector mounted to the motherboard; and
a second connector mounted to the motherboard, said second connector being horizontally offset with respect to said first connector on the motherboard;
the optical transceiver module comprising:
a housing open at an end;
a first electronic board fixed within said housing and having an edge proximate said open of said housing;
a second electronic board fixed within said housing and having an edge proximate said open end of said housing beyond said edge of said first electronic board; and
an optical interface configured to receive an optical cable;
wherein the optical transceiver module is configured to be pluggably connected to the motherboard connector assembly via the edge of the first electronic board that is configured to electrically connect with the first connector of the motherboard connector assembly and the edge of the second electronic board that is configured to electrically connect with the second connector of the motherboard connector assembly, and wherein the first electronic board and the first connector carry signals for a single bi-directional communication channel and the second electronic board and the second connector carry signals for each of multiple bi-directional communication channels.

10. The combination of claim 9, wherein the first connector is configured to achieve a small form-factor pluggable (SFP) connection with the first electronic board of the optical transceiver module.

11. The combination of claim 9, wherein the edges of the first and second electronic boards are offset from each other by a distance corresponding to a distance that the first and second connectors on the motherboard are offset from each other.

12. A system having a motherboard connector assembly and an optical transceiver module, the motherboard connector assembly comprising:
a motherboard;
a multi-row connector mounted to the motherboard comprising an upper row connector and lower row connector relative to a plane of the motherboard; and
the optical transceiver module comprising:
a housing open at an end;
a first electronic board fixed within said housing and having an edge with electrical contacts configured to be electrically connected to the lower row connector;
a second electronic board fixed within said housing and having an edge with electrical contacts configured to be electrically connected to the upper row connector; and
an optical interface configured to receive an optical cable;
wherein the optical transceiver module is configured to be pluggably connected to the dual row connector of the motherboard connector assembly, and wherein the edge of the first electronic board and the edge of the second electronic board are spaced within the housing such that when the optical transceiver module is plugged into the dual row connector the electrical contacts of the first and second electronic boards are electrically coupled to the lower and upper row connectors, respectively.

13. The system of claim 12, wherein at least one of the first and second electronic boards is a transmitting board with optical transmission components, and configured to receive electrical signals from the motherboard connector assembly and transmit one or more optical signals via the optical transmission components though the optical interface.

14. The system of claim 13, wherein the optical transmission components are one of laser diodes and light emitting diodes.

15. The system of claim 13, further comprising an optical cable with a ferrule element configured to plug into the optical interface, wherein the ferrule element comprises an angled surface such that any light emitted from the optical transmission components associated with a transmit and receive fiber pair comprising a transmit fiber and a receive fiber is reflected from the angled surface away from an aperture of the receive fiber.

16. The system of claim 12, wherein at least one the first and second electronic boards is a receiving board with optical reception components, and configured to receive optical signals via the optical interface and transmit electrical signals to the motherboard connector assembly via electrical contacts.

17. The system of claim 16, wherein the optical reception components are laser detectors or photo diodes.

18. The system of claim 12, wherein one of the first and second electronic boards is a transmission board configured to receive electrical signals from the motherboard connector assembly and transmit one or more optical signals, and the other electronic board is a receiving board configured to receive optical signals and transmit electrical signals to the motherboard connector assembly.

19. The system of claim 18, wherein the optical transceiver module is configured to form transmission and reception optical channel pairs using the first and second electronic boards.

20. The system of claim 18, wherein the optical transceiver module is configured to transmit and receive on single optical fibers using the first and second electronic boards.

* * * * *